(12) United States Patent
Sato

(10) Patent No.: US 10,063,224 B2
(45) Date of Patent: Aug. 28, 2018

(54) DRIVER CIRCUIT AND SEMICONDUCTOR MODULE HAVING SAME

(71) Applicant: Fuji Electric Co., Ltd., Kanagawa (JP)

(72) Inventor: Tadahiko Sato, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/803,701

(22) Filed: Nov. 3, 2017

(65) Prior Publication Data
US 2018/0159522 A1 Jun. 7, 2018

(30) Foreign Application Priority Data
Dec. 7, 2016 (JP) .................. 2016-237277

(51) Int. Cl.
| | |
|---|---|
| *H03K 17/081* | (2006.01) |
| *H02M 1/32* | (2007.01) |
| *H02M 3/158* | (2006.01) |
| *H03K 17/687* | (2006.01) |
| *H03K 17/0812* | (2006.01) |
| *H02M 1/00* | (2006.01) |

(52) U.S. Cl.
CPC ........ *H03K 17/08104* (2013.01); *H02M 1/32* (2013.01); *H02M 3/158* (2013.01); *H03K 17/08122* (2013.01); *H03K 17/6871* (2013.01); *H02M 2001/0038* (2013.01); *H03K 2217/0063* (2013.01); *H03K 2217/0072* (2013.01)

(58) Field of Classification Search
CPC ....... H03K 17/08104; H03K 17/08122; H03K 17/08142; H03K 17/687; H03K 17/6871; H03K 17/6874; H03K 2217/0063; H03K 2217/0072; H02M 1/32; H02M 3/156; H02M 3/158; H02M 2001/0038
See application file for complete search history.

(56) References Cited

U.S. PATENT DOCUMENTS

| | | | |
|---|---|---|---|
| 7,843,237 B2 * | 11/2010 | Strzalkowski | H03K 17/6871 327/108 |
| 9,312,852 B2 * | 4/2016 | De Geeter | H03K 17/6871 |
| 2011/0148376 A1 * | 6/2011 | Xu | H03K 17/165 323/282 |
| 2018/0159529 A1 * | 6/2018 | Reusch | G05F 1/571 |

FOREIGN PATENT DOCUMENTS

| | | |
|---|---|---|
| JP | 2001-069757 A | 3/2001 |
| JP | 2010-178579 A | 8/2010 |

* cited by examiner

*Primary Examiner* — Patrick O'Neill
(74) *Attorney, Agent, or Firm* — Chen Yoshimura LLP

(57) ABSTRACT

An output of a gate driver that drives a main switch is connected to the gate of the main switch, and a low-voltage side power supply terminal of the gate driver is connected to a source of the main switch via a current limiting resistor. Moreover, a suppression capacitor for suppressing rapid changes in current, having a prescribed capacitance, is connected between the drain of the main switch of a main circuit and the low-voltage side power supply terminal of the gate driver. This makes it possible to suppress the rapid change in current that occurs when the main switch switches OFF as well as to prevent extremely large currents from occurring in a low-voltage side power supply line of the driver circuit.

6 Claims, 8 Drawing Sheets

First example of driver circuit configuration in one embodiment of present invention Operation of driver circuit in one embodiment of present invention Operation of a low-side circuit model that suppresses rapid changes in
current (di/dt) occurring from ON/OFF of main switch
in one embodiment of present invention When Tr is ON When Tr is OFF Example of typical configuration of conventional driver circuit

DRIVER CIRCUIT AND SEMICONDUCTOR MODULE HAVING SAME

BACKGROUND OF THE INVENTION

Technical Field

The present invention relates to a driver circuit for use in a power converter such as a DC-DC converter or an inverter for driving a motor, and to a semiconductor module including the driver circuit.

Background Art

In discrete power semiconductors such as metal-oxide-semiconductor field-effect transistors (MOSFETs) and insulated-gate bipolar transistors (IGBTs), as well as in intelligent power modules (IPMs) and modules that include such devices in a single product, driver circuits are used to drive the power semiconductor devices (hereinafter, main switches). In the driver circuit illustrated in FIG. 5, for example, an output terminal (Vout) 73 of a gate driver 72 in a driver circuit 70 is connected to the gate of a main switch (M11) 81 of a main circuit 80, another terminal (a low-side power supply terminal ($V_L$) 74 of the driver circuit 70) is connected to a source ($V_S$) 82 of a power semiconductor device (the main switch M11) 81, and thus the gate-source (GS) voltage of the main switch (M11) 81 is controlled to switch the main switch (M11) 81 ON and OFF. In a module-type product, this driver circuit would be embedded with the power semiconductor device in a module. Moreover, here the symbol $V_S$ is intended to indicate both the source terminal itself as well as the source voltage (and the same applies below).

A corresponding configuration can be achieved when using an IGBT for the main switch of the main circuit 80 by replacing the source of the MOSFET with the emitter, replacing the drain of the MOSFET with the collector, and replacing the gate-source (GS) with a gate-emitter (GE). Furthermore, in the case described below where the main switch is a MOSFET, the drain-source (DS) would be replaced with collector-emitter (CE) to achieve the corresponding configuration.

FIG. 5 illustrates an example of a typical configuration of a conventional driver circuit. In FIG. 5, the output terminal (Vout) 73 of the gate driver 72 in the driver circuit 70 and the gate of the main switch (M11) 81 of the main circuit 80 are connected together via a gate resistor (Rg) 75 in order to suppress rapid changes in current (di/dt) during turning ON and turning OFF of the main switch (M11) 81.

FIG. 6 is a diagram for explaining the operation (first example) of a conventional driver circuit. FIG. 6 shows the driver circuit illustrated in FIG. 5, and when the main switch (M11) 81 switches OFF, a parasitic inductance component caused by wiring or the like present between the source side of the main switch (M11) 81 and a reference voltage, as well as a rapid change in current (−di/dt) when the main switch (M11) 81 switches OFF, cause the source voltage ($V_S$) 82 of the main switch (M11) 81 to decrease rapidly below the reference voltage. When the source voltage ($V_S$) 82 of the main switch (M11) 81 becomes a low voltage, the source of the main switch in the circuit and the low-voltage side power supply terminal ($V_L$) 74 of the driver circuit 70 are connected together by low impedance. This can potentially allow an excessively large current to flow from the reference voltage to the source ($V_S$) 82 via the low-voltage side power supply line of the driver circuit, which could cause the low-voltage side power supply line of the driver circuit to burn out or cause the driver circuit to malfunction.

FIG. 7 is a diagram for explaining the operation (second example) of a conventional driver circuit. As illustrated in FIG. 7 and described in Patent Document 1, in order to address the potential issues described above with reference to FIG. 6, the output terminal (Vout) 73 of the gate driver 72 in the driver circuit 70 is connected directly to the gate terminal of the main switch (M11) 81, and a current limiting resistor ($R_R$) 76 is inserted between the other terminal (the low-voltage side power supply terminal ($V_L$) 74 of the driver circuit 70) and the source 82 of the main switch (M11) 81. This reduces the possibility of burnout or malfunctions due to excessively large currents in the low-voltage side power supply line of the driver circuit.

FIG. 8 is a diagram for explaining the operation (third example) of a conventional driver circuit. In FIG. 8, the driver circuit illustrated in FIG. 7 is arranged on the high side, and the high-side driving power supply utilizes a bootstrap configuration to drive the driver circuit. In other words, in FIG. 8, when a low-side main switch 2 (M12) 84 (illustrated in the lower right) switches ON, current from a driving power supply 110 (illustrated in the upper left) flows to a bootstrap diode (D1) 111 to a bootstrap capacitor (C1) 112 and thereby stores power therein.

Then, when the low-side main switch 2 (M12) 84 switches OFF and a high-side main switch (M11) 81 switches ON, the power stored in the bootstrap capacitor (C1) 112 becomes the high-side driving power supply, and a gate driver 92 in a high-side driver 95 is operated via control of a controller 91 in a driver circuit 90.

When the output of the gate driver 92 switches ON the high-side main switch 1 (M11) 81, power from the main circuit 80 is supplied to a load (not illustrated in the figure) that is connected to the source side of the high-side main switch 1 (M11) 81.

Moreover, a current limiting resistor ($R_R$) 113 illustrated in FIG. 8 is similar to the current limiting resistor ($R_R$) 76 illustrated in FIG. 7 and prevents excessive currents resulting from the switching of the main switches from flowing to the low-voltage side power supply line of the driver circuit. Note that parasitic inductance 83 caused by power supply lines or the like is also present between the source of the low-side main switch 2 (M12) 84 and a main circuit reference voltage. Furthermore, similar to the high-side driver, a low-side driver 96 has the same configuration illustrated in FIG. 7 and therefore will not be described here.

RELATED ART DOCUMENT

Patent Document

Patent Document 1: Japanese Patent Application Laid-Open Publication No. 2001-069757

SUMMARY OF THE INVENTION

Adding the current limiting resistor ($R_R$) connects together the source of the main switch and the low-voltage side power supply terminal of the driver circuit via the current limiting resistor ($R_R$). Therefore, even if the source voltage becomes a lower voltage than the reference voltage of the driver circuit due to parasitic inductance on the source side of the main switch and due to a rapid change in current (−di/dt) when the main switch switches OFF, the current limiting resistor ($R_R$) makes it possible to reduce the current flowing from the reference voltage of the driver circuit to the source of the main switch via the low-voltage side power supply line of the driver circuit.

This, in turn, makes it possible to suppress the flow of current from the low-side power supply of the driver circuit to the source of the main switch when the source takes a negative voltage.

Here, in order to suppress the rapid change in current (di/dt) that occurs when the main switch switches OFF, the resistance of the current limiting resistor ($R_R$) must be set to a large value. However, setting the resistance of the current limiting resistor ($R_R$) to a large value conversely causes the following problems.

(1) When the resistance of the current limiting resistor ($R_R$) is set to a large value, the impedance between the source of the main switch and the low-voltage side power supply terminal of the driver circuit becomes high regardless of whether the main switch is ON or OFF. As a result, the main switch is more prone to erroneously switching ON or OFF due to other switches (not illustrated in the figure) in the driver circuit switching ON and OFF or due to external noise.

(2) When a plurality of power semiconductor devices (main switches) are used to form an upper/lower arm configuration and a gate driver in the driver circuit drives the high-side main switch, it is common to use a bootstrap configuration for the high-side driving power supply (see FIG. 8). However, when the low-side main switch is switched ON to charge a bootstrap capacitor (C1) that then becomes the high-side driving power supply, because the current limiting resistor ($R_R$) is present on the charging path of the bootstrap capacitor (C1), the current limiting resistor ($R_R$) impedes the charging of the bootstrap capacitor (C1).

Accordingly, the present invention is directed to a scheme that substantially obviates one or more of the problems due to limitations and disadvantages of the related art. In particular, in some embodiments, the present invention aims to provide a driver circuit that, without having to excessively increase the resistance of a current limiting resistor ($R_R$), suppresses the rapid changes in current (di/dt) accompanying switching of a power semiconductor device and also prevents excessively large currents resulting from such rapid changes (di/dt) from occurring in a low-voltage side power supply line of the driver circuit. Moreover, the present invention aims to provide a semiconductor module including such a driver circuit.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a driver circuit, including: a main circuit part that includes a power semiconductor device, the main circuit supplying power to a load to be connected thereto by power conversion through switching ON and OFF the power semiconductor device; a driver circuit part that includes a gate driver that drives the power semiconductor device of the main circuit part and a controller that controls the gate driver, an output of the gate driver being connected to a gate of the power semiconductor device to switch ON and OFF the power semiconductor device; a current limiting resistor provided in series in a path connecting a low-voltage side power supply terminal of the gate driver to a source of the power semiconductor device; and a suppression capacitor connected between a drain of the power semiconductor device and the low-voltage side power supply terminal of the gate driver.

In the driver circuit, the gate driver may be provided in a high-side driver circuit part for driving the load.

Moreover, in the driver circuit, the gate driver may be provided in a low-side driver circuit part for driving the load.

Furthermore, the current limiting resistor may be packaged together with the power semiconductor device.

Furthermore, in the driver circuit, the driver circuit part, the main circuit part, and the current limiting resistor are installed together in a single module.

In another aspect, the present disclosure provides a semiconductor module including the driver circuit of the aforementioned aspect, wherein the driver circuit part, the main circuit part, the current limiting resistor, and the suppression capacitor are installed together in a single module.

The driver circuit according to the present invention makes it possible to, without having to excessively increase the resistance of a current limiting resistor, suppress the rapid changes in current (di/dt) accompanying switching of a power semiconductor device such as an IGBT or a MOSFET and also prevent extremely large currents resulting from such rapid changes (di/dt) from occurring in a low-voltage side power supply line of the driver circuit. It is to be understood that both the foregoing general description and the following detailed description are exemplary and explanatory, and are intended to provide further explanation of the invention as claimed.

BRIEF DESCRIPTION OF THE DRAWINGS

FIG. 4A illustrates how current flows when a low-side main switch is ON, and FIG. 4B illustrates how current flows when the main switch transitions from ON to OFF.

DETAILED DESCRIPTION OF EMBODIMENTS

Next, an embodiment of the present invention will be described in detail.

Figure 1:
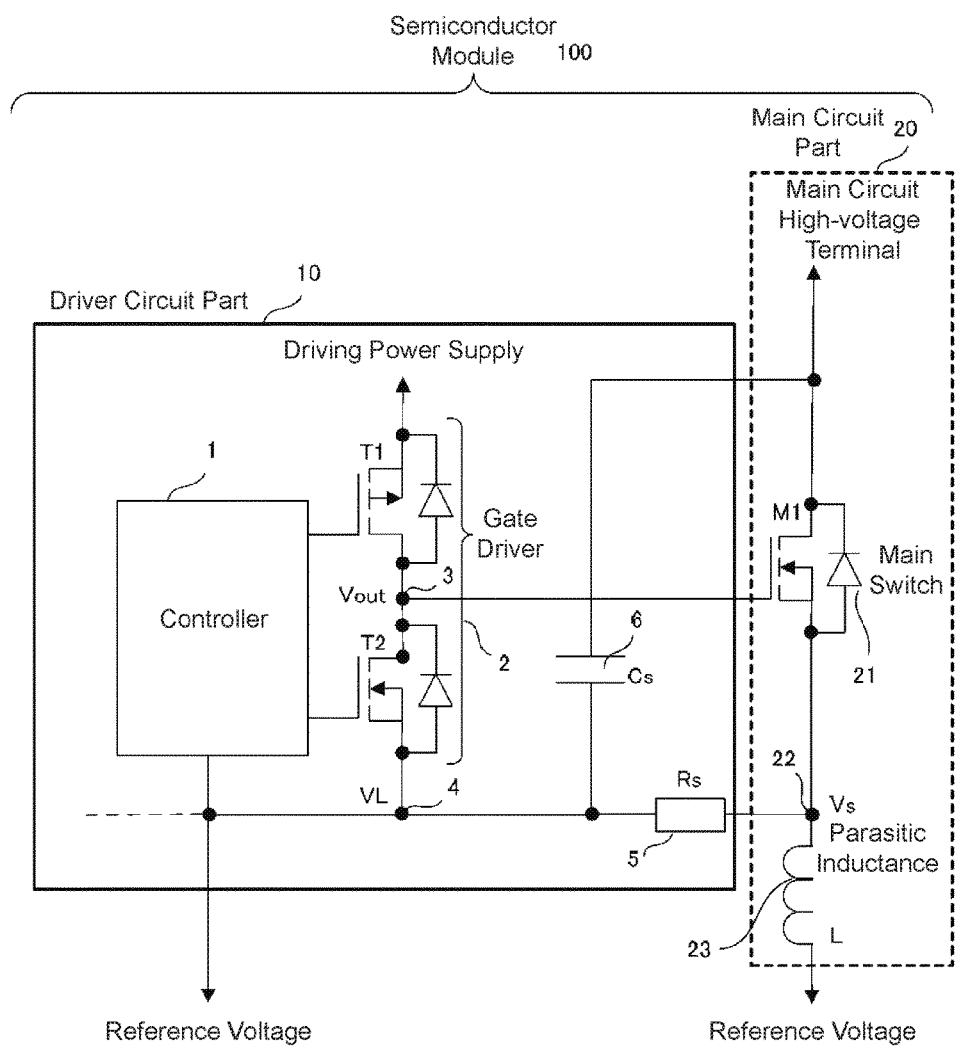
FIG. 1 illustrates a configuration (first example) of a driver circuit according to an embodiment of the present invention.

FIG. 1 illustrates a configuration of a driver circuit according to the embodiment of the present invention. The driver circuit according to the embodiment of the present invention can be generally divided into a driver circuit 10 and a main circuit 20. In this case, the driver circuit 10 and the main circuit 20 can be embedded in a single product to form a semiconductor module 100.

The driver circuit 10 illustrated in FIG. 1 includes a controller 1 that controls and drives a gate driver 2; the gate driver 2, in which a first transistor T1 and a second transistor T2 are directly connected in series between a driving power supply and a reference voltage, and in which an output (Vout) 3 is obtained from a node between the transistors T1 and T2; a current limiting resistor ($R_S$) 5 connected between a low-voltage side power supply terminal ($V_L$) 4 of the gate driver 2 (the source of the second transistor T2) and the source of a power semiconductor device (a main switch M1) 21; and a suppression capacitor ($C_S$) 6 connected between the low-voltage side power supply terminal ($V_L$) 4 of the gate driver 2 and the drain of the power semiconductor device (main switch M1) 21.

Note that although the controller 1 and the gate driver 2 are depicted as being separate components in the example illustrated in FIG. 1, these components may be embedded into a single product to form a module or may be integrated into the same semiconductor integrated circuit.

Similarly, although in the example illustrated here the current limiting resistor ($R_S$) 5 and the suppression capacitor ($C_S$) 6 are depicted as being separate components from the controller 1 and the gate driver 2, these components may be packaged together along with the controller 1 and the gate driver 2 into the same module.

The output (Vout) 3 of the gate driver 2 that drives the power semiconductor device (main switch M1) 21 is connected to the gate of the main switch (M1), and the low-voltage side power supply terminal ($V_L$) 4 of the gate driver 2 is connected to a source ($V_S$) 22 of the main switch (M1) via the current limiting resistor ($R_S$) 5.

Moreover, the suppression capacitor ($C_S$) 6 (for suppressing rapid changes in current) has a prescribed capacitance and is connected between the drain of the main switch (M1) of the main circuit 20 and the source of the second transistor T2 of the gate driver 2; i.e., the low-voltage side power supply terminal 4 of the gate driver 2.

With this configuration, increasing the capacitance of the suppression capacitor ($C_S$) 6 makes it possible to, without having to set the resistance of the current limiting resistor ($R_S$) 5 to a large value, suppress the rapid change in current (di/dt) that occurs when the power semiconductor device (main switch M1) 21 switches OFF. This will be described in more detail later.

Furthermore, the current limiting resistor ($R_S$) 5 makes it possible to suppress current flowing through the reference voltage (such as ground) of the driver circuit 10 and the low-voltage side power supply terminal ($V_L$) 4 to the source 22 of the power semiconductor device (main switch M1) 21, which takes a negative voltage when the main switch (M1) switches OFF. The suppression capacitor ($C_S$) 6 makes it possible to suppress the rapid change in current (di/dt) that occurs when the main switch (M1) switches OFF. This will also be described in more detail later.

Figure 2:
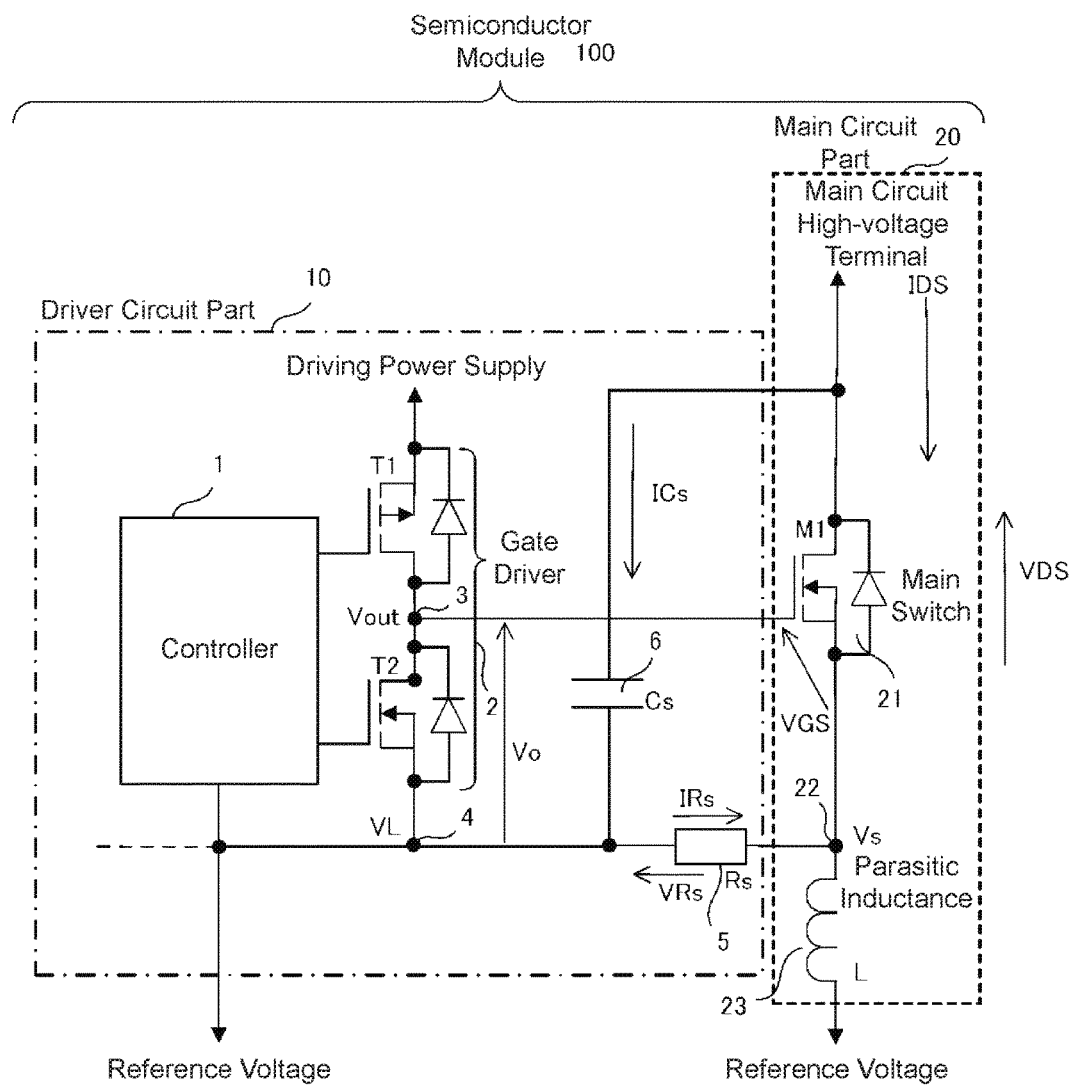
FIG. 2 is a diagram for explaining the operation of the driver circuit according to the embodiment of the present invention.

FIG. 2 is a diagram for explaining the operation of the driver circuit according to the embodiment of the present invention. Next, the following items will be described with reference to FIG. 2.

<1> Suppressing Rapid Changes in Current (di/dt)

In FIG. 2, the controller 1 controls the gates of the transistors T1 and T2 of the gate driver 2 in order to apply a prescribed output (Vout) 3 from the gate driver 2 to the gate of the main switch (M1) 21. The output (Vout) 3 of the gate driver 2 causes the gate voltage of the switch (M1) 21 of the main circuit 20 to increase and also causes the gate-source voltage (VGS) of the switch (M1) 21 to increase.

When the VGS of the switch (M1) 21 exceeds the operating threshold of the switch (M1) 21, the switch (M1) 21 transitions from the OFF state to the ON state (switches ON), and when the VGS of the switch (M1) 21 becomes less than the operating threshold, the switch (M1) 21 transitions from the ON state to the OFF state (switches OFF).

During these transitions, the current IDS flowing through the drain-source voltage (VDS) of the switch (M1) 21 causes rapid changes in magnitude (di/dt). This will be described in more detail later with reference to FIGS. 4A and 4B.

<2> Suppressing Negative Voltage at Low-Voltage Terminal of Main Switch

Figure 7:
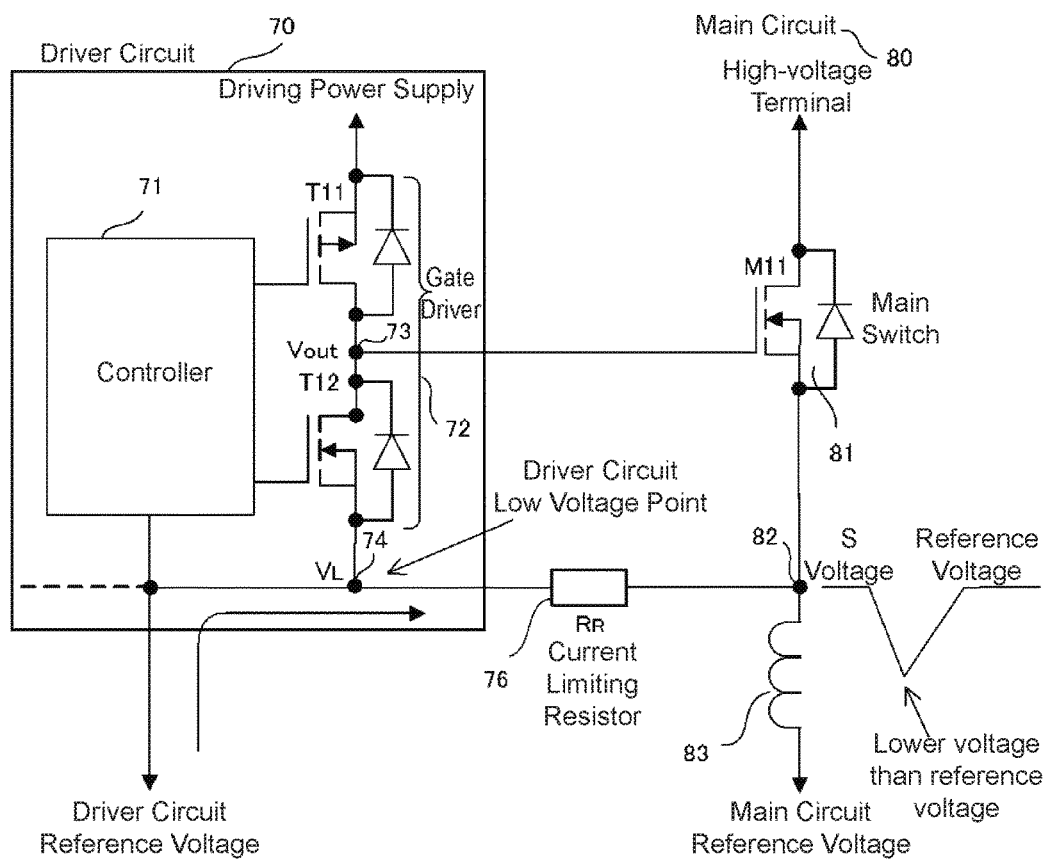
FIG. 7 is a diagram for explaining the operation (second example) of a conventional driver circuit.
Figure 8:
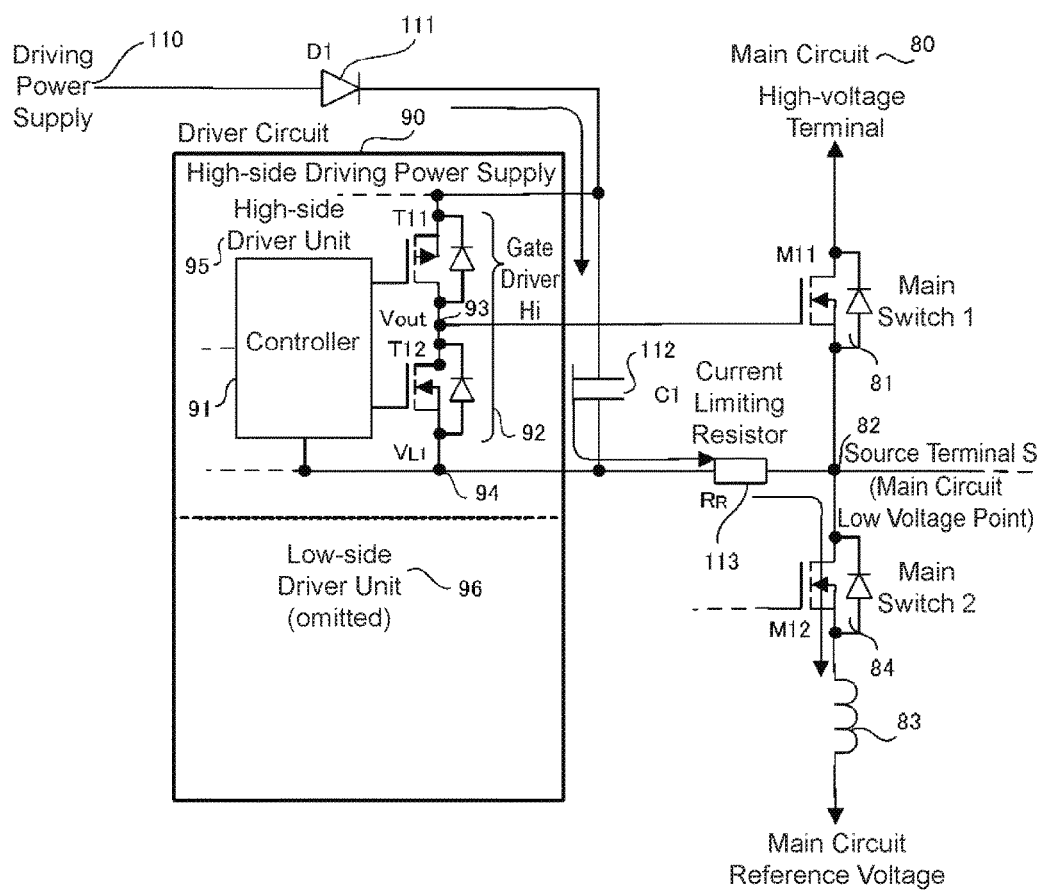
FIG. 8 is a diagram for explaining the operation (third example) of a conventional driver circuit.

When the switch (M1) 21 switches OFF, the current IDS flowing through the drain-source voltage (VDS) of the main switch (M1) 21 is blocked. When this happens, due to the rapid change in current (di/dt) and parasitic inductance (L) 23 such as wiring inductance present between the source of the main switch (M1) 21 and the reference voltage of the driver circuit, the source voltage ($V_S$) 22 of the main switch (M1) 21 takes a negative value relative to the reference voltage, as illustrated in FIG. 7.

Figure 6:
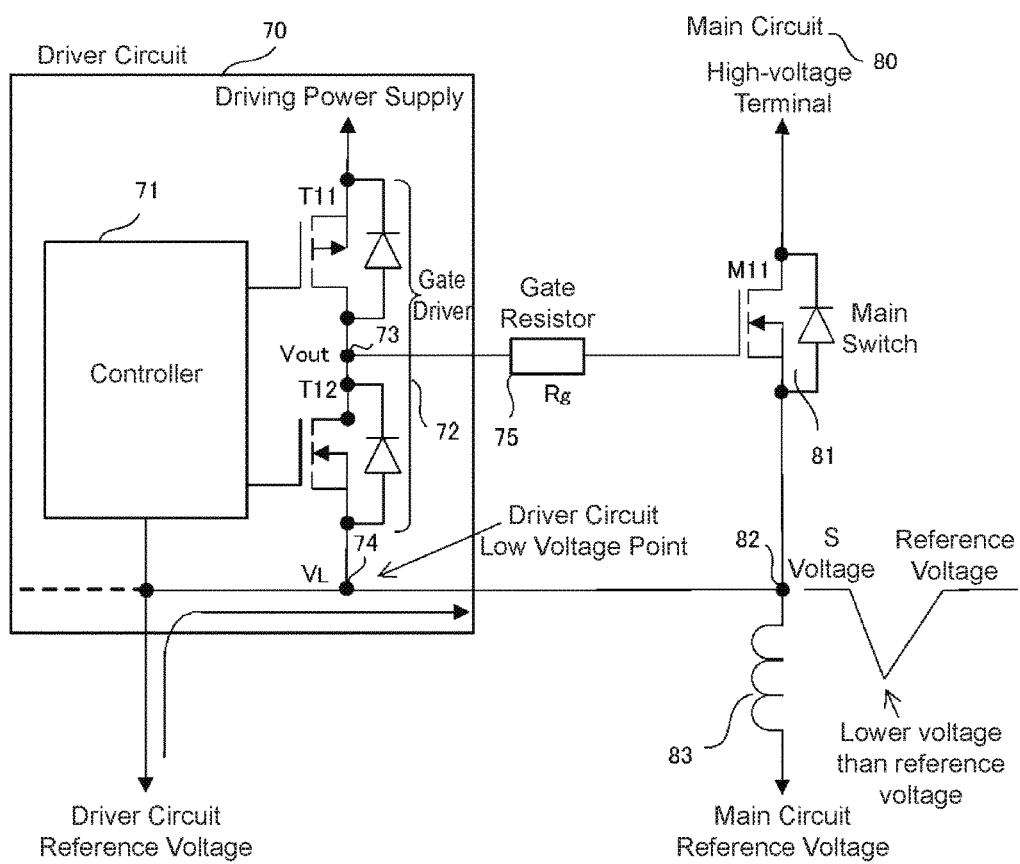
FIG. 6 is a diagram for explaining the operation (first example) of a conventional driver circuit.

Here, as explained above with reference to FIG. 6, if no current limiting resistor were present between the low-voltage side power supply terminal ($V_L$) 4 of the driver circuit 10 and the source 22 of the main switch (M1) 21, the low-voltage side power supply terminal ($V_L$) 4 of the driver circuit 10 would takes a voltage equal to the voltage ($V_S$) of the source 22, and a large current would flow from the reference voltage on the driver circuit 10 side to the source 22 (which has a negative voltage) via the low-voltage side power supply line.

Figure 3:
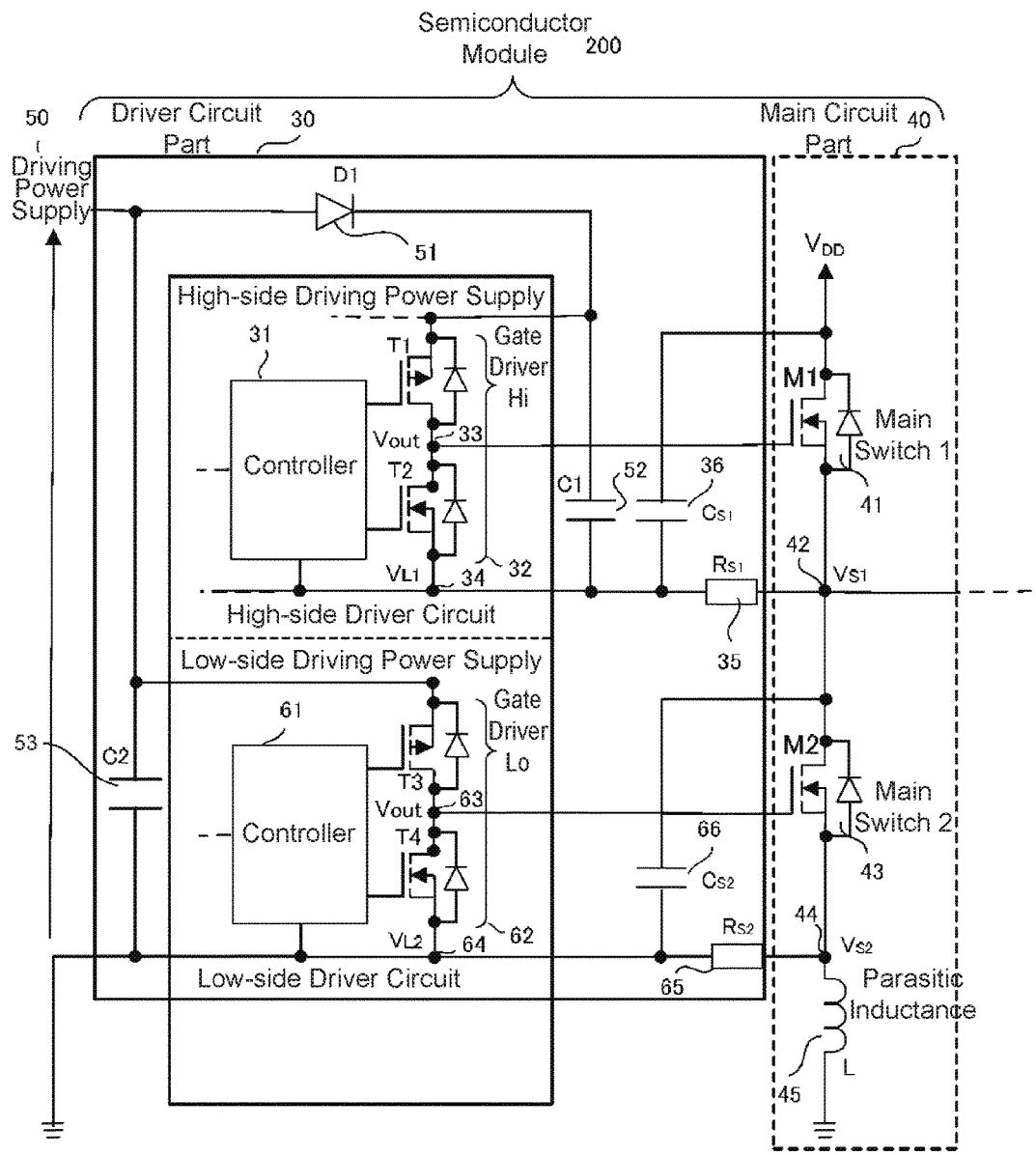
FIG. 3 illustrates a configuration (second example) of the driver circuit according to the embodiment of the present invention.

FIG. 3 illustrates a configuration (second example) of the driver circuit according to an embodiment of the present invention. The driver circuit illustrated in FIG. 3 can be generally divided into a driver circuit 30 and a main circuit 40. With respect to the driver circuit 30, the configuration of the driver circuit illustrated in FIG. 1 is used for both the high side and the low side, and a bootstrap configuration is used in the high-side driving power supply. In this configuration, the driver circuit 30 and the main circuit 40 can still be embedded into a single product to form a semiconductor module 200.

In FIG. 3, when a low-side main switch 2 (M2) 43 switches ON, current from a driving power supply 50 (illustrated in the upper left) flows through a bootstrap diode (D1) 51 to a bootstrap capacitor (C1) 52 and thereby stores electrical energy therein.

Then, when the low-side main switch 2 (M2) 43 switches OFF, the electrical energy stored in the bootstrap capacitor (C1) 52 becomes the high-side driving power supply. Furthermore, a gate driver 32 in a high-side driver is operated via control performed by a controller 31 in the driver circuit 30, which uses the bootstrap capacitor (C1) 52 as a power supply.

An output terminal (Vout) 33 of the gate driver 32 is connected to the gate of a high-side main switch 1 (M1) 41, and when the output of the gate driver 32 is high level and causes the gate voltage of the main switch 1 (M1) 41 to exceed the operating threshold, the high-side main switch 1 (M1) 41 switches ON. When this happens, power from the main circuit 40 is supplied to a load (not illustrated in the figure) that is connected to the source side of the high-side main switch 1 (M1) 41.

Moreover, a low-side driver is always driven by the driving power supply 50. Furthermore, the capacitor (C2) 53 is a decoupling capacitor added to the driving power supply 50 line. The operation of the low-side driver is the same as the operation of the high-side driver and therefore will not be described here.

Moreover, a current limiting resistor ($R_{S1}$) 35 and a current limiting resistor ($R_{S2}$) 65 illustrated in FIG. 3 are both equivalent to the current limiting resistor ($R_R$) 76 illustrated in FIG. 7 and are respectively connected between a source ($V_{S1}$) 42 of the high-side main switch 1 (M1) 41 and a low-voltage side power supply terminal ($V_{L1}$) 34 of the gate driver Hi 32 and between a source ($V_{S2}$) 44 of the low-side main switch 2 (M2) 43 and a low-voltage side power supply terminal ($V_{L2}$) 64 of a gate driver Lo 62. A suppression capacitor ($C_{S1}$) 36 and a suppression capacitor ($C_{S2}$) 66 are both equivalent to the suppression capacitor ($C_S$) 6 illustrated in FIG. 1. Moreover, the reference character 45 indicates a parasitic inductance connected to the source ($V_{S2}$) of the low-side main switch 2 (M2) 43.

Figure 4A:
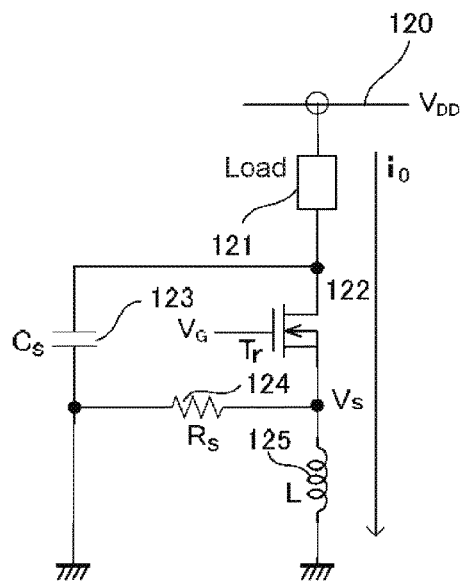
FIGS. 4A and 4B are diagrams for explaining the operation of a low-side circuit model that suppresses the rapid changes in current (di/dt) that occur when a main switch according to the embodiment of the present invention switches ON and OFF.
Figure 4B:
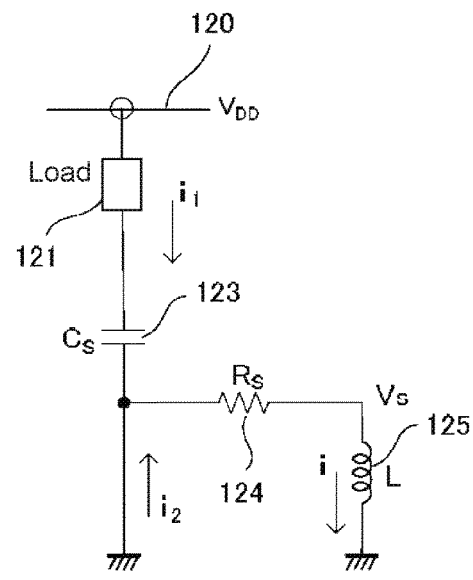
Figure 5:
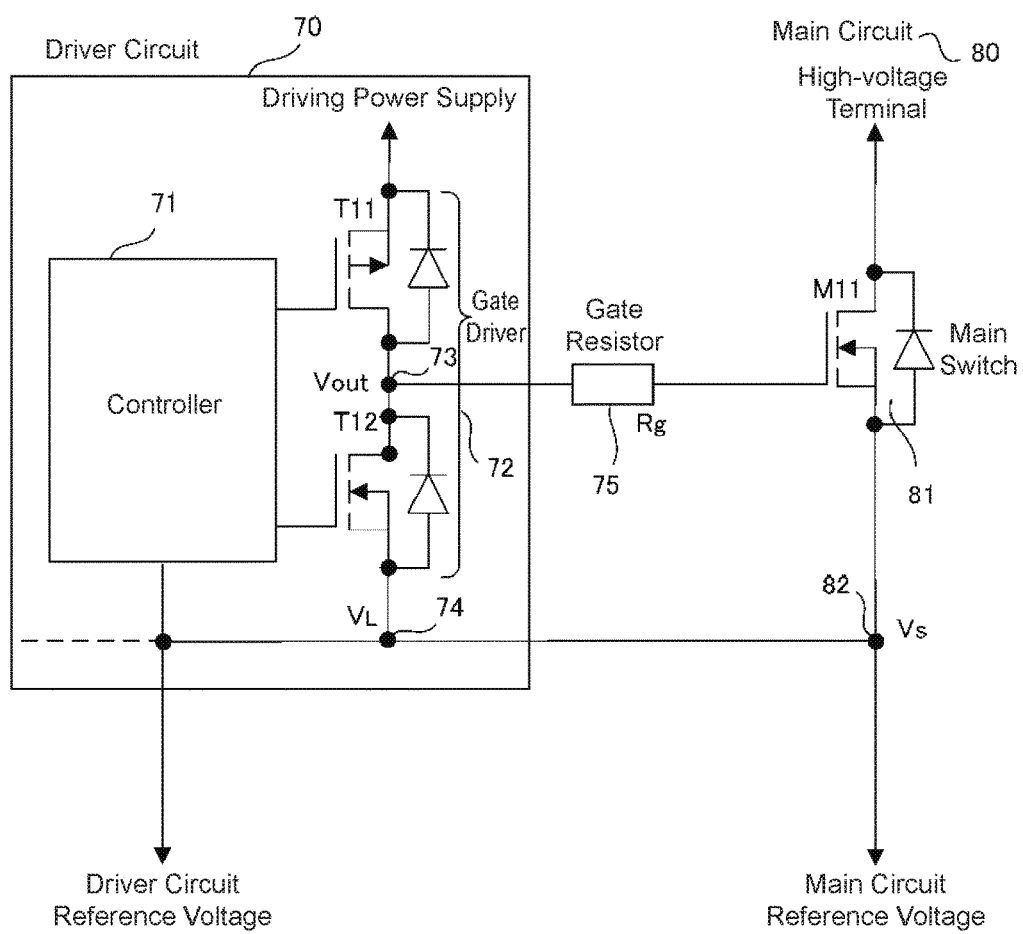
FIG. 5 illustrates an example of a typical configuration of a conventional driver circuit.

FIGS. 4A and 4B are diagrams for explaining, using a model, the operation of a low-side circuit that suppresses the rapid changes in current (di/dt) that occur when a main switch according to the embodiments of the present invention switches ON and OFF. This model corresponds to the configuration (second example) of the driver circuit as illustrated in FIG. 3. Moreover, the rapid change in current (di/dt) that occurs when the main switch switches ON is similar to when the main switch switches OFF, therefore will not be described here.

FIG. 4A illustrates how current flows when a low-side main switch Tr (122) is ON.

As illustrated in FIG. 4A, the left end of a current limiting resistor $R_S$ (124) is connected to ground in order to reference the voltage to a reference voltage (such as ground) of the low-side driver circuit.

When the main switch Tr (122) illustrated in FIG. 4A switches ON and reaches steady-state, di/dt becomes approximately zero, and therefore the source $V_S$ of the main switch Tr (122) becomes approximately 0V relative to the reference voltage (ground) of the low-side driver circuit. As a result, there is no voltage difference across the terminals of the current limiting resistor $R_S$ (124), and no current flows to the current limiting resistor $R_S$ (124).

Therefore, a current $i_0$ that flows from a power supply $V_{DD}$ of the main circuit through a load 121 proceeds to flow to the drain (D) and the source (S) of the switched-ON main switch Tr (122) to a parasitic inductance L (125) and the ground. Due to this, electrical energy accumulates in the parasitic inductance L (125). Moreover, the load 121 represents the total impedance of the high-side configuration as viewed from the low side.

Meanwhile, FIG. 4B illustrates how current flows when the main switch Tr (122) transitions from ON to OFF and will be used to explain how the rapid change in current (di/dt) flowing to the parasitic inductance L (125) that occurs when the main switch Tr (122) of the low-side driver circuit switches OFF is suppressed, as well as how the large negative voltage that occurs at the source $V_S$ of the main switch Tr (122) due to this rapid change in current (di/dt) is reduced.

As illustrated in FIG. 4B, when the main switch Tr (122) switches OFF, the source $V_S$ of the main switch Tr (122) becomes negative, and current begins to flow to the current limiting resistor $R_S$ (124).

This current includes a current $i_1$ that flows from the power supply $V_{DD}$ of the main circuit through the load 121 and then flows through both ends of a suppression capacitor $C_S$ (123), as well as a current $i_2$ that circulates in from the ground on the left end of the current limiting resistor $R_S$ (124) (that is, current that is supplied from the low-voltage side power supply line of the driver circuit), which combine as a current i that flows to the current limiting resistor $R_S$ (124). This current i also flows to the parasitic inductance L (125).

Analyzing the transient response of a circuit including the current limiting resistor $R_S$ (124) and the parasitic inductance L (125) illustrated in the figure in this state yields the following.

$$i=i_1+i_2 \quad (1)$$

$$R_S \times i + L(di/dt) = 0 \quad (2)$$

$$(di/dt) = -(R_S/L) \times i \quad (3)$$

The current i that occurs when the main switch switches OFF corresponds to the transient response of the current $i_0$ from when the main switch is ON, and therefore:

$$i = i_0 \exp(-t/(L/R_S)) \quad (4)$$

$$(di/dt) = -(R_S/L) \times i_0 \exp(-t/(L/R_S)) \quad (5)$$

Thus, as the resistance of the current limiting resistor $R_S$ (124) decreases, the time constant increases, (di/dt) decreases, and the fall in the source voltage $V_S$ decreases. Conversely, as the resistance of the current limiting resistor $R_S$ (124) increases, the time constant decreases, (di/dt) increases, and the fall in the source voltage $V_S$ increases.

Moreover, a portion of the current $i_0$ that was flowing through the load 121 continues to flow to the suppression capacitor $C_S$ (123) side as the current $i_1$ even when the main switch Tr (122) switches OFF, thereby making it possible to reduce the current $i_2$ supplied from the low-voltage side power supply line of the driver circuit by a corresponding amount. In other words, this makes it possible to reduce the flow of excess current to the driver circuit. Furthermore, the load 121 typically has a non-zero inductance component including some degree of parasitic inductance, and therefore the larger this inductance component is, the larger the portion of the current $i_0$ that continues to flow as the current $i_1$ is.

The present embodiment also exhibits another (di/dt) suppression effect in addition to the one described above. The analysis above assumes that the current flowing to the main switch Tr (122) is instantaneously blocked when transitioning from the state illustrated in FIG. 4A to the state illustrated in FIG. 4B. In the present embodiment, however, such an abrupt shutdown of the current actually does not occur; i.e., the rate of change (di/dt) of the current flowing to the main switch Tr (122) is reduced.

As described above, when the gate voltage VG of the main switch Tr (122) is decreased to attempt to switch OFF the main switch Tr (122), the source voltage $V_S$ of the main switch Tr (122) takes a negative voltage. When this happens, because $V_S$ is negative, the gate-source voltage VGS=VG−$V_S$ of the main switch Tr (122) increases. In other words, when the gate voltage VG is decreased to switch OFF the main switch Tr (122), a feedback effect that inhibits this change is applied to the gate-source voltage VGS, thereby making it possible to make the current flowing to the main switch Tr (122) change more gradually. This, in turn, makes it possible to reduce the rate of change (di/dt) in current flowing to the parasitic inductance.

Although the circuit model illustrated in FIGS. 4A and 4B are examples for a low-side circuit, the same approach can be applied to a high-side circuit example (not illustrated in the figure) except in that the load would be connected between the source of the main switch and the source $V_S$, and therefore this case will not be described here.

INDUSTRIAL APPLICABILITY

The driver circuit of the present invention is not limited to use in switching power supplies (power converters) such as motor-driving inverters and DC-DC converters and can also be applied to power supplies (power converters) for computers, communication devices, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A driver circuit, comprising:
a main circuit part that includes a power semiconductor device, the main circuit supplying power to a load to be connected thereto by power conversion through switching ON and OFF the power semiconductor device;
a driver circuit part that includes a gate driver that drives the power semiconductor device of the main circuit part and a controller that controls the gate driver, an output of the gate driver being connected to a gate of the power semiconductor device to switch ON and OFF the power semiconductor device;
a current limiting resistor provided in series in a path connecting a low-voltage side power supply terminal of the gate driver to a source of the power semiconductor device; and
a suppression capacitor connected between a drain of the power semiconductor device and the low-voltage side power supply terminal of the gate driver.

2. The driver circuit according to claim 1, wherein the gate driver is provided in a high-side driver circuit unit for driving said load.

3. The driver circuit according to claim 1 wherein the gate driver is provided in a low-side driver circuit unit for driving said load.

4. The driver circuit according to claim 1, wherein the current limiting resistor is packaged together with the power semiconductor device.

5. The driver circuit according to claim 1, wherein the driver circuit part, the main circuit part, and the current limiting resistor are installed together in a single module.

6. A semiconductor module comprising the driver circuit of claim 1, wherein the driver circuit part, the main circuit part, the current limiting resistor, and the suppression capacitor are installed together in a single module.

* * * * *